US006624660B2

(12) United States Patent
Li et al.

(10) Patent No.: US 6,624,660 B2
(45) Date of Patent: Sep. 23, 2003

(54) CMOS OUTPUT DRIVER FOR SEMICONDUCTOR DEVICE AND RELATED METHOD FOR IMPROVING LATCH-UP IMMUNITY IN A CMOS OUTPUT DRIVER

(75) Inventors: Wen Li, Boise, ID (US); Michael D. Chaine, Boise, ID (US); Manny Kin Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/010,820

(22) Filed: Dec. 6, 2001

(65) Prior Publication Data

US 2003/0107406 A1 Jun. 12, 2003

(51) Int. Cl.[7] ................. H03K 19/094; H03K 19/0175; H03K 3/01
(52) U.S. Cl. .......................... 326/83; 326/86; 327/534
(58) Field of Search .................. 326/83, 80, 82, 326/86–87, 112, 119, 121, 101; 327/534, 108, 109, 111, 112

(56) References Cited

U.S. PATENT DOCUMENTS

| | | | | |
|---|---|---|---|---|
| 4,327,368 A | * | 4/1982 | Uchida | ................. 257/373 |
| 4,476,479 A | * | 10/1984 | Saito | ................. 257/370 |
| 5,513,140 A | | 4/1996 | Merritt | |
| 5,680,071 A | * | 10/1997 | Senoh et al. | ............. 327/390 |
| 5,687,122 A | | 11/1997 | Merritt | |
| 5,801,423 A | | 9/1998 | Manning | |
| 5,945,713 A | | 8/1999 | Voldman | |
| 5,966,026 A | | 10/1999 | Partovi et al. | |
| 5,990,523 A | * | 11/1999 | Hsia | ................. 257/372 |
| 6,005,797 A | | 12/1999 | Porter et al. | |
| 6,072,728 A | | 6/2000 | Merritt | |
| 6,141,263 A | | 10/2000 | Protzman | |
| 6,154,418 A | | 11/2000 | Li | |
| 6,207,512 B1 | | 3/2001 | Manning | |
| 6,222,387 B1 | | 4/2001 | Meng et al. | |
| 6,326,832 B1 | * | 12/2001 | Macaluso | ............. 327/534 |
| 6,414,515 B1 | * | 7/2002 | Kunz et al. | ............. 326/81 |

* cited by examiner

Primary Examiner—Daniel Chang
Assistant Examiner—James H. Cho
(74) Attorney, Agent, or Firm—Winstead, Sechrest & Minick; Hugh R. Kress

(57) ABSTRACT

An output driver circuit for a semiconductor device. In one embodiment, the output driver is coupled to an output terminal of the semiconductor device and consists of an N-channel pull-down transistor and a P-channel pull-up transistor formed in an N-well in a P-type substrate. A tie-down region formed in the N-well is selectively coupled to a supply potential by means of a decoupling transistor, and during normal operation of the driver maintains the supply voltage bias of the N-well. An overdrive detection circuit is coupled to the output terminal. Upon detection of an overdrive condition on the output terminal, such as a voltage exceeding a predetermined maximum, or excessive current injected into the output terminal (or both), the overdrive detection circuit deasserts a control signal applied to the gate of the decoupling transistor, thereby decoupling the N-well from the supply potential. In one embodiment, the decoupling transistor is not coupled to the output terminal.

18 Claims, 5 Drawing Sheets

CMOS OUTPUT DRIVER FOR SEMICONDUCTOR DEVICE AND RELATED METHOD FOR IMPROVING LATCH-UP IMMUNITY IN A CMOS OUTPUT DRIVER

FIELD OF THE INVENTION

This invention relates generally to semiconductor devices, and more particularly relates to method and apparatuses for interfacing semiconductor devices with external circuitry.

BACKGROUND OF THE INVENTION

The field of semiconductor memory devices generally and complementary metal-oxide semiconductor (CMOS) devices in particular is enormously active and rapidly developing. Various categories and sub-categories of semiconductor devices are known and commercially available. The ever-increasing popularity and ubiquity of computers and computer-based devices, both in the consumer and industrial realms, is such that the demand for semiconductor memory devices of a variety of different types will continue to grow for the foreseeable future.

Semiconductor devices require input, output, and/or input/out (I/O) circuitry for interfacing them with external circuitry, including other semiconductor devices. In the context of a circuit for outputting signals from a semiconductor devices, the term "output driver" is often used. For example, on the input/output terminals of a semiconductor memory device, an output (or input/output) driver is required to present binary digital output signals on the I/O terminals. Most commonly, a logical low (binary "0") signal is represented in a semiconductor by a substantially zero voltage. As semiconductor technologies have evolved, the standard voltage for representing a logical "high" (binary "1") signal has been being reduced from an earlier standard of 5 volts to an increasingly common 3.3 volts. For reasons relating to, among other factors, power consumption, thermal performance, speed, and device size, it is entirely possible that the standard voltage for representation of a logical high (binary "1") voltage could be reduced even further as semiconductor technologies evolve.

The shift to lower operating voltages in semiconductor devices has not occurred all at once within the semiconductor industry. Hence, there has been an ongoing desire for semiconductor devices which are capable of recognizing a range of logical voltages, for example, recognizing either 1.8 volts or 2.5 volts as a logical high (binary "1") voltage. Even for semiconductor devices intended to operate only at one operating voltage, however, care must be taken to ensure that the device can withstand an occasional or even sustained overdrive condition without adverse consequences. Those of ordinary skill in the art will understand that the term "overdrive condition" is used to refer to voltages or currents at an electrical node, such as at an input pad, which exceed specified levels, such as a manufacturer's specification of the "normal" operating parameters of a part. "Overdrive conditions" can be contrasted with what is typically referred to as a "normal operating conditions", i.e., condition specified by a semiconductor device manufacturer to be within specified limits. By way of example, for an input/output pin on a semiconductor device specified for operation with a supply voltage of 3.3 volts, a voltage of greater than five volts present on that pad might be considered an overdrive condition.

Those of ordinary skill in the art will be familiar with some of the widely recognized and well-documented problems associated with overdrive conditions occurring at I/O terminals (and other electrical nodes) of semiconductor devices. One especially common problem is the potential for latch-up conditions resulting from overdrive conditions within a semiconductor device. Those of ordinary skill in the art will understand that a common type of "latch-up" condition is caused when parasitic (i.e., unintentional) conduction paths are created between otherwise separate semiconductor regions as a result of an overdriving of the I/O pad. Such conditions can create sustained current flow between adjacent semiconductor regions, causing the semiconductor circuitry to cease proper function or even to self-destruct.

Semiconductor I/O devices are especially susceptible to latch-up owing to their exposure to external conditions, including the application of external voltages or currents exceeding specified limits. A semiconductor input/output circuit commonly comprises a "pull-up" device and a "pull-down" device. The term "pull-up" device refers to the circuitry adapted to pull an output node to the desired logical high (binary "1") voltage, e.g., 3.3 volts or 5 volts, whereas the term "pull-down" device refers to the circuitry adapted to pull an output node to a desired logical low (binary "0") voltage (typically 0 voltages). In order to satisfy the performance requirements of modern semiconductor circuits, conventional data output buffers often employ N-channel metal oxide semiconductor (NMOS) transistors in both the pull-up and pull-down circuits. Perceived advantages of using NMOS pull-up transistors in an output driver rather than P-channel metal oxide semiconductor (PMOS) transistors include smaller size, and less susceptibility to latch-up. These considerations are discussed in U.S. Pat. No. 6,141,263 to Protzman, entitled "Circuit and Method for a High Transfer Rate Output Driver," which patent is commonly assigned to the assignee of the present invention and is hereby incorporated by reference herein in its entirety.

On the other hand, there are also perceived advantages to using PMOS transistors in output drivers. One such advantage is switching speed, since it is generally understood that a PMOS pull-up transistor switches at a faster speed than an NMOS transistor, not requiring a boosted control signal on its gate. However, unlike an NMOS driver, a PMOS driver has the potential to increase a buffer circuit's susceptibility to cause latch-up of adjacent CMOS circuits. In common implementations of PMOS output drivers, when the I/O pad's voltage or current conditions exceed certain levels, a parasitic P+to N-well junction is forward-biased, and a parasitic P-N diode can be formed between the pad's P+ diffusion and the N+ diffusion guard ring. This results in heavy injected current into the N-well. This injected current is then capable of forward biasing other parasitic PNP structures, ultimately leading to the injection of hole current into the P substrate.

In a so-called "pumped substrate" design, where the substrate is not directly tied to ground but instead is negatively biased by a P-substrate charge pump, any large injection of hole current into the substrate can readily overwhelm the pump, making such a design highly susceptible to I/O-injected latch-up. The latch-up problem is potentially more severe in pumped substrate devices, because the typical latch-up prevention scheme of grounding the P-substrate with P+ guard rings cannot be utilized. The negative pump generator can only provide a limited amount of negative current to counter the positive current injected into the P-substrate or P-well. Latch-up occurs when the parasitic PN diode formed by the P-channel driver transistor and the $V_{cc}$ N+ guard ring biases the N-well to a high enough voltage to turn on the parasitic vertical PNP transistor connected between the P+ driver diffusion, the N-well, and the P-substrate. If enough hole current is injected into the P-substrate, then the local P-substrate voltage potential can increase to above $V_{diode}$ (the forward voltage of a PN diode). This increase in the P-substrate potential will forward-bias parasitic PN diodes of nearby $V_{ss}$ N+ active areas, resulting in the triggering of the parasitic PNPN latch-up devices between I/O and Vss or between the power supplies $V_{cc}$ and $V_{ss}$.

Although there are many aspects of circuit design and layout that are important to the subject of latch-up, there are a few well-known basic features that can be incorporated into a CMOS device to reduce susceptibility to latch-up. Among the more important of these are design techniques that avoid the formation of parasitic bipolar transistors in CMOS circuitry.

For example, one technique that both decouples parasitic bipolar transistors and other parasitic structures to improve isolation of MOS transistors is to form a deep trench between structures on the substrate. Such "trench isolation" typically involves etching a narrow, deep groove in the silicon substrate and then filling the trench with oxide or polysilicon. Such a trench structure, though reasonably effective in—delaying the onset of triggering of latch-up—, undesirably occupies valuable silicon area and complicates the semiconductor fabrication process.

It is also recognized that substrate tie-downs—the regions formed to make ohmic contact with supply voltages for biasing portions of the substrate to desired voltages—can be configured to diminish parasitic effects. One approach in particular is to configure such substrate tie-downs as rings which encircle certain regions thereby functioning as guard rings which reduce the lifetime of minority carriers (electrons in a P-well, holes in an N-well). An N-well formed in a P-substrate, for example, may have a well tie-down coupled to the supply potential and configured as a ring around its perimeter, so as to act as a sink for minority carriers injected into the N-well when neighboring parasitic devices are forward-biased. This approach is discussed in U.S. Pat. No. 5,801,423 to Manning et al., entitled "Apparatus for Improving Latchup Immunity in a Dual Polysilicon Gate Process," which patent is hereby incorporated herein by reference in its entirety.

The use of tie-downs or guard rings alone may not sufficiently delay the onset of latch-up in a given implementation. Indeed, as discussed herein below, guard rings themselves can be contributing factors to the formation of parasitic structures, since those guard rings that are tied to a supply voltage can serve as the source of parasitic current.

Thus, despite semiconductor designers' ongoing efforts to minimize I/O circuitry's tolerance of overdrive conditions, there continues to be an ongoing need for I/O buffer/driver circuitry that is more tolerant of overdrive conditions and less susceptible to latch-up.

SUMMARY OF THE INVENTION

In view of the foregoing considerations, the present invention is directed to an output driver circuit for a semiconductor device.

In one embodiment of the invention, a control transistor is provided for the selective decoupling of a particular connection within the driver circuit to a supply potential. An overdrive detection circuit coupled to the output node of the device is adapted to detect overdrive conditions on the output node, including the application of excessive voltages and the injection of current, and upon detection of such overdrive conditions, to assert a control signal that is applied to the control transistor's gate. In operation, the overdrive detection circuit functions to disable the control transistor, thereby decoupling the connection to the supply potential and averting conditions leading to undesirable parasitic conduction within the CMOS circuit.

In accordance with one feature of the invention, the overdrive detection circuit is conditioned to respond only to overdrive conditions on an output node, and absent such overdrive conditions—such as during normal pull-up operations where voltage and/or current conditions are maintained within acceptable specified limits—to maintain connection of the supply potential to the driver circuit.

In accordance with another feature of the invention, the overdrive detection circuit does not itself require additional control circuitry likely to adversely affect the operational performance of the driver circuit. Additionally, the present invention does not involve the use of a decoupling switch tied directly to the output node, thereby altering the operational properties of the driver circuit.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF SPECIFIC EMBODIMENTS OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Figure 1:
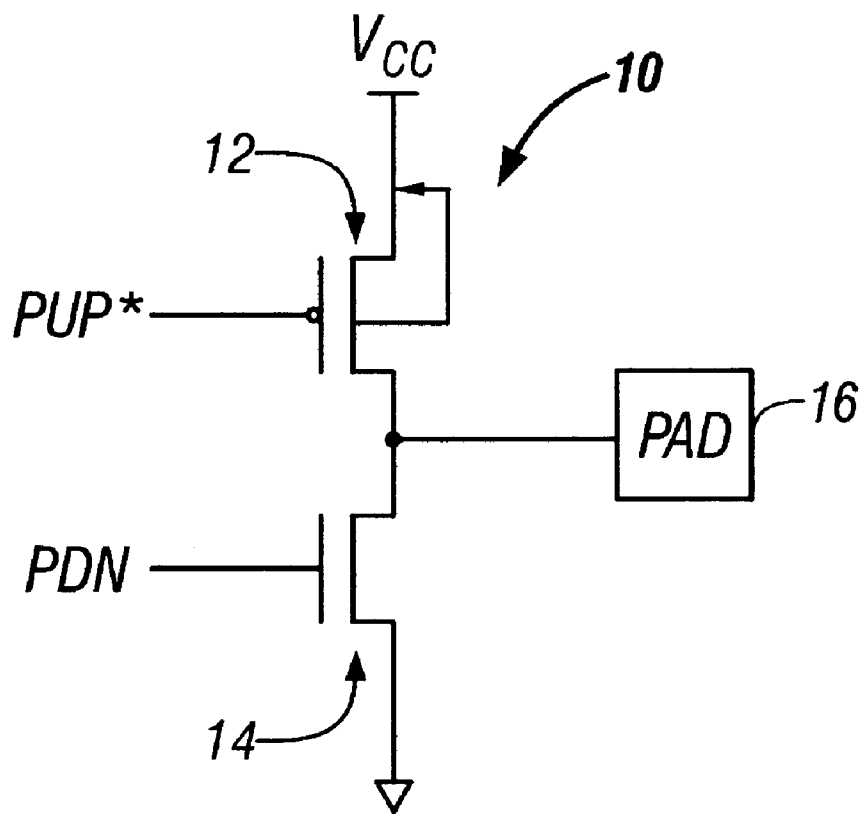
FIG. 1 is a schematic diagram of a prior art output driver circuit for a semiconductor device.

Referring to FIG. 1, there is shown a schematic diagram of a conventional output driver circuit 10. Driver circuit 10 comprises a P-channel pull-up transistor 12 and an N-channel pull-down transistor 14. Circuit 10 operates to drive either a logical high voltage (e.g., 3.3 volt or 5 volt) output signal on input/output (I/O) pad 16, or a logical low voltage (e.g., 0 volt) output signal on I/O pad 16, depending upon whether signal PUP* is asserted (low) or signal PDN is asserted (high). (Those of ordinary skill in the art will be familiar with the nomenclature which uses an asterisk ("*") to indicate that a digital logic signal is "asserted" when it is at a logical low (typically, 0 volt) level.) In one embodiment, driver circuit 10 may be associated with an I/O pin of a semiconductor device, such as a semiconductor memory device.

Figure 2A:
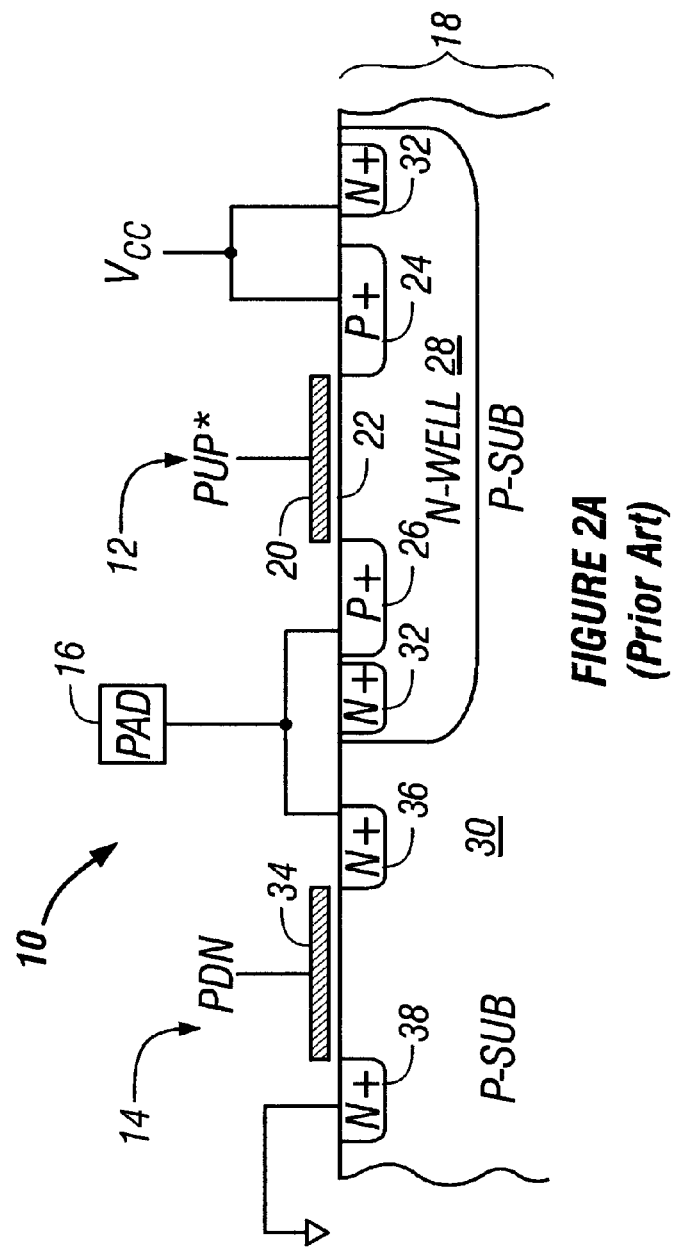
FIG. 2a is a side cross-sectional view of the driver circuit of FIG. 1 implemented on a semiconductor substrate.

FIG. 2a shows a side cross-sectional view of driver circuit 10 as fabricated on a semiconductor substrate 18. Those of ordinary skill in the art will recognize that circuit 10 is implemented as a conventional complementary metal-oxide-semiconductor (CMOS) device on a silicon substrate, and that pull-up transistor 12 and pull-down transistor are implemented as conventional field effect transistors (FETs). As shown in FIG. 2a, pull-up transistor 12 comprises a gate terminal 20 to which pull-up signal PU* is applied, disposed over an N-channel 22 between source and drain P+ diffusions 24 and 26, respectively. (As used herein, the term "coupled to" shall be interpreted to involve an electrical connection between two circuit elements, whether or not intervening elements may be present). Source diffusion 24 is coupled to a supply potential $V_{cc}$ of, for example, 3.3 volts or 5 volts. Drain diffusion 26 is coupled to contact pad 16.

Pull-up transistor 12 of driver 10 is disposed within an N-well 28 formed in P-type substrate 30. Encircling pull-up transistor 12 is an N+ tie-down and guard ring 32 which, as shown in FIG. 2a, is coupled to source potential $V_{cc}$ to bias N-well. Those of ordinary skill in the art will appreciate that in addition to biasing N-well 28, providing guard ring 32 coupled to $V_{cc}$ tends to improve latch-up immunity in driver 10, as is discussed in U.S. Pat. No. 6,207,512 to Manning, entitled "Method and Apparatus for Improving Latch-up Immunity in a Dual-Polysilicon Gate Process." The Manning '512 patent is commonly assigned to the assignee of the present invention and is hereby incorporated by reference herein in its entirety.

With continued reference to FIG. 2a, pull-down transistor 14 comprises a gate 34 to which the pull-down signal PDN is applied, disposed over P-type substrate 30 between source and drain N+ diffusions 36 and 38, respectively. Drain diffusion 38 is coupled to ground; source diffusion 36 is coupled to—pad 16.

With regard to FIG. 2a and other cross-sectional representations in this disclosure, those of ordinary skill in the art will appreciate that certain simplifications have been made for the purposes of clarity. For example, those of ordinary skill in the art will appreciate that the gates of FET transistors such as transistors 12 and 14 are separated from the silicon substrate by an insulating layer such as an oxide layer or the like. Such oxide layers are not specifically depicted in the Figures, though, as noted, this is done only for the sake of clarity and those of ordinary skill in the art will readily recognize where such simplifications have been made in the Figures.

As in most CMOS semiconductor devices, it is possible for certain parasitic bipolar and other devices to be formed in driver 10. Those of ordinary skill in the art will appreciate that a "parasitic" device is one that is formed unintentionally, usually as a result of the physical placement of the CMOS structures and diffusions. The avoidance of undesired parasitic devices and their effects on device performance is of constant concern to semiconductor device manufacturers.

Figure 2B:
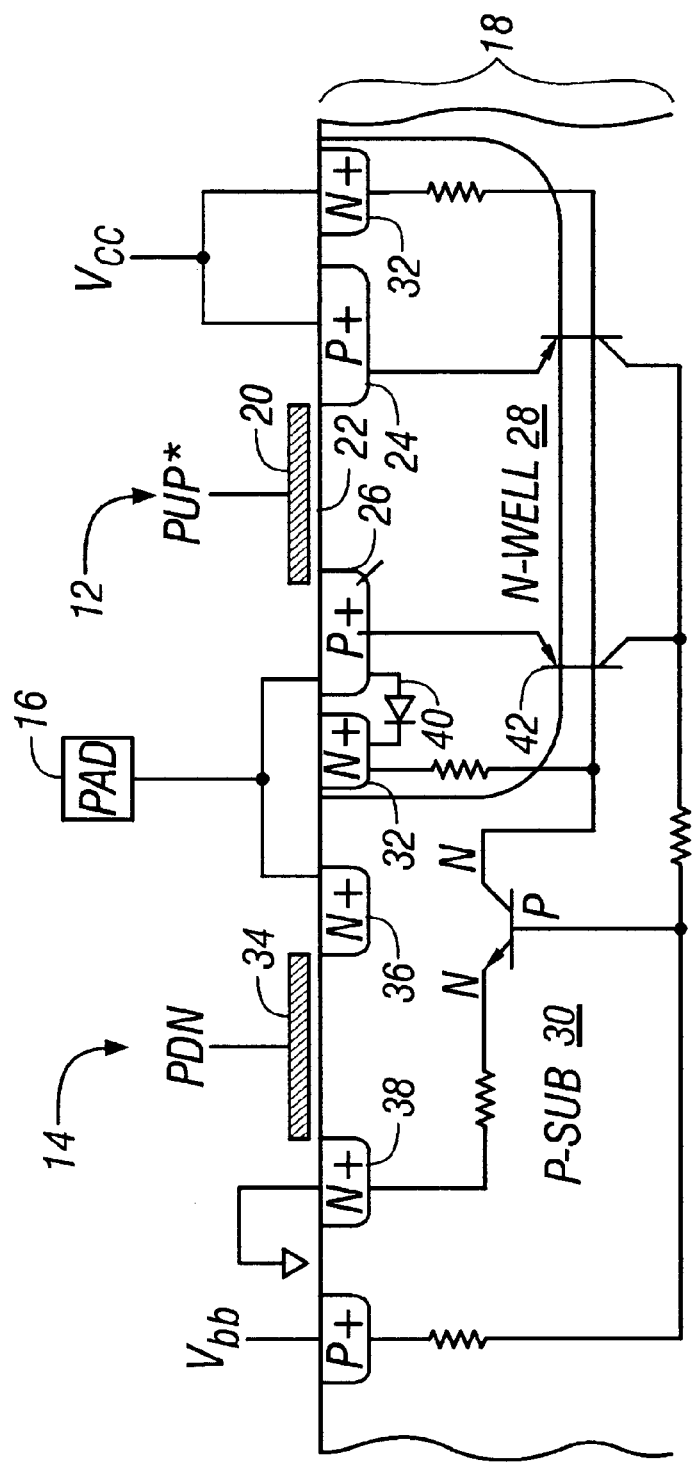
FIG. 2b is the side cross-sectional view of FIG. 2a with schematic representations of certain parasitic devices superimposed thereon.

In FIG. 2b, there is shown another side, cross-sectional representation of driver 10 from FIGS. 1 and 2a, with device 10 in FIG. 2a having a schematic diagram showing various parasitic devices that are present therein. First, there is a P-N junction between P+ diffusion 26 and N-well 28, identified with reference numeral 40 in FIG. 2b. In addition, there is a vertical P-N-P bipolar transistor 42 formed by P+ diffusion 26, N-well 28, and P-type substrate 30.

Those of ordinary skill in the art will recognize that if the voltage on pad 16 exceeds supply potential $V_{cc}$ by one forward voltage ($V_{DIODE}$), parasitic P-N junction 40 becomes forward biased. If this occurs, another parasitic P-N diode 44 is formed between P+ diffusion 26 and the N+ guard ring 32, resulting in heavy injected current into N-well 38. This current forward-biases the parasitic P-N-P transistor 42. When P-N-P transistor 42 turns on, hole current is injected into P-substrate 30. This hole current, in turn, positively pulls up the local P-substrate potential and tends to forward bias nearby N+ diffusions that are coupled to ground.

In the case of device 10, N+ diffusion 38 in pull-down transistor 14 is coupled to ground, such that if hole current is injected into P-substrate 30 as described, a parasitic N-P-N transistor 46 is formed by N+ diffusion 38, P-substrate 30, and N-well 28. When transistors 42 and 46 turn on, this results in the formation of a parasitic PNPN device (essentially, a silicon controlled rectifier) between supply potential $V_{cc}$ and ground, comprising P+ diffusion 24 in transistor 12, which is coupled to $V_{cc}$, N-well 28, P-substrate 30, and N+ diffusion 38. Those of ordinary skill will appreciate that if this PNPN device turns on due to the turning on of parasitic transistor 46, latch-up will occur. If device 10 uses a so-called pumped substrate design, in which P-substrate 30 is not tied directly to ground, but is instead negatively biased a substrate pump (providing a substrate bias voltage $V_{bb}$), any large injection of hole current into substrate 30 can overwhelm such a pump, making the device more susceptible to I/O injected latch-up as described herein. The present invention is, in one aspect, directed to overcoming this potential problem.

Figure 3:
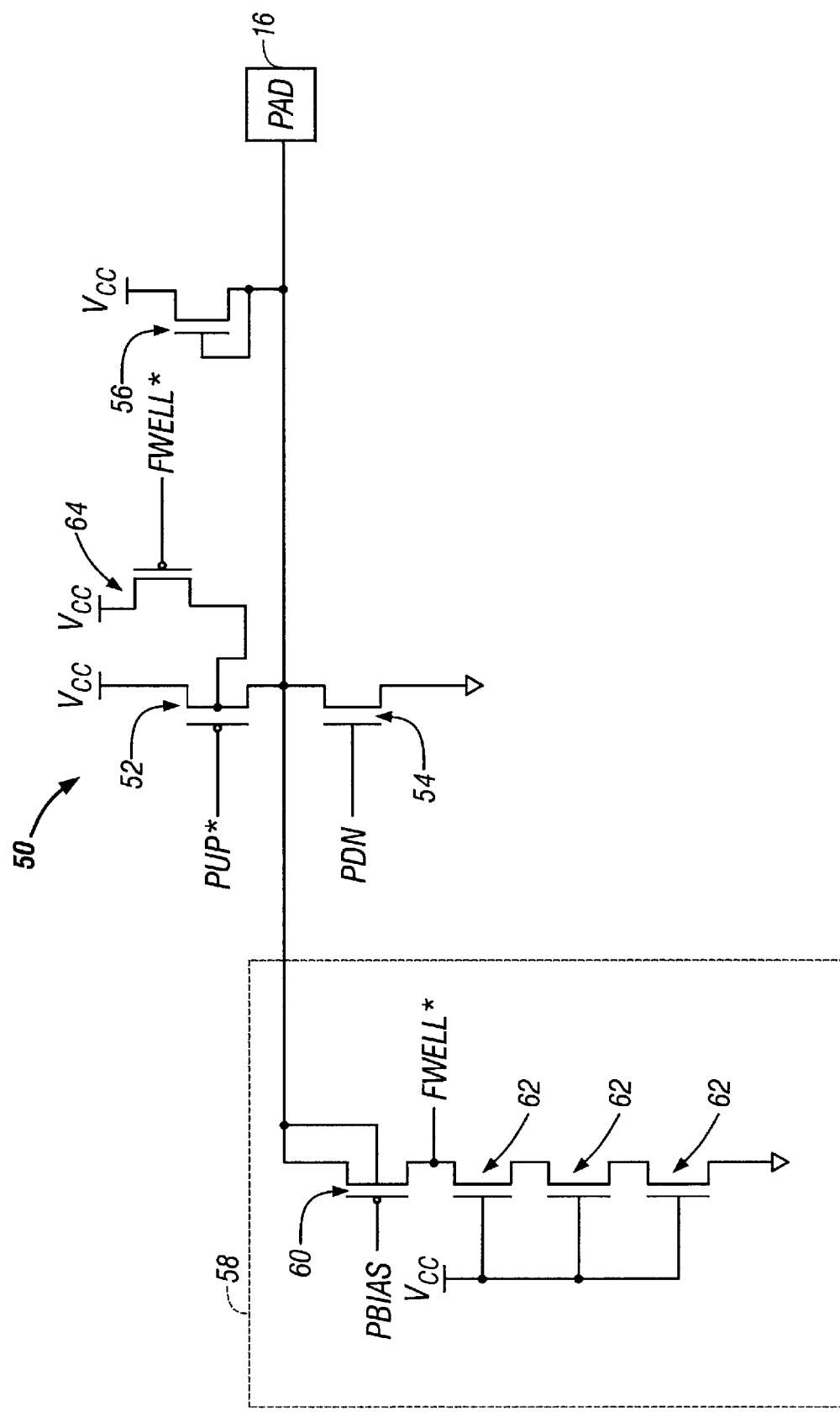
FIG. 3 is a schematic diagram of the an output driver circuit in accordance with one embodiment of the invention.

Turning to FIG. 3, there is shown a schematic diagram of an output driver circuit 50 in accordance with one embodiment of the invention. As shown in FIG. 3, driver circuit 50 comprises a P-channel pull-up transistor 52 having the asserted-low pull-up signal PUP* applied to its gate, and an N-channel pull-down transistor 54 having the asserted-high pull-down signal PDN applied to its gate. The output of driver circuit 50 is applied to pad 16; a clamp transistor 56 is coupled to the driver output to limit the pad voltage to not greater than $V_{cc} + V_t$ (where $V_t$ is the threshold voltage of transistor 56).

With continued reference to FIG. 3, driver circuit 50 also comprises an overdrive detection circuit 58. Overdrive detection circuit 58 comprises a P-channel transistor 60 and a plurality of N-channel pull-down transistors 62. A PBIAS signal is held on the gate of P-channel detection transistor 60, whose substrate and source terminal are each coupled to I/O pad terminal 16 and whose drain is coupled to the gate of decoupling transistor 64 to provide the FWELL* signal thereto. Overdrive detection circuit generates an output signal FWELL*, which is applied to the gate of a P-channel decoupling transistor 64 whose drain is coupled to the N-well of pull-up transistor 52. The gates of transistors 62 are tied to $V_{cc}$, keeping them on.

In accordance with one aspect of the invention, the PBIAS signal is maintained at a level of, for example, approximately 2 to 2.5 volts, turning P-channel transistor 60 off during normal operating conditions. With transistors 62 turned on, the FWELL* signal is held at a logical low (asserted) level, thereby maintaining a connection between supply potential $V_{cc}$ and holding decoupling transistor 64 on.

Transistors 62 preferably have relatively long channel widths, such that they conduct low current and exhibit a high resistance, on the order of 1 megaohms. That is, transistors 62 provide a relatively high resistive coupling between the drain of detection transistor 60 and ground. Therefore, if an overdrive condition occurs on I/O pad terminal 16, because of the connection of pad terminal 16 to the gate of detection transistor 60, the FWELL* signal will tend toward a logical high level, turning off decoupling transistor 64 and decoupling the connection between $V_{cc}$ and guardring 76 (shown in FIG. 4). In accordance with one aspect of the invention, the biasing voltage PBIAS and the resistance of transistors 62 are selected such that the FWELL* voltage level at the drain of detection transistor 60 substantially follows the pad voltage only during an overdrive condition on pad 16, thereby keeping decoupling transistor 64 off during overdrive conditions. This minimizes the leakage current through parasitic diode 44, thereby averting the chain reaction of parasitic device leakage that leads to latch-up. Since overdrive detection circuit 58 is only responsive to overdrive conditions, however, N-well 28 is not permitted to float during normal pull-up operations. Moreover, since decoupling transistor 64 is not coupled to the output terminal 16, it has no adverse effect upon the performance and operation of driver circuit 50.

Figure 4:
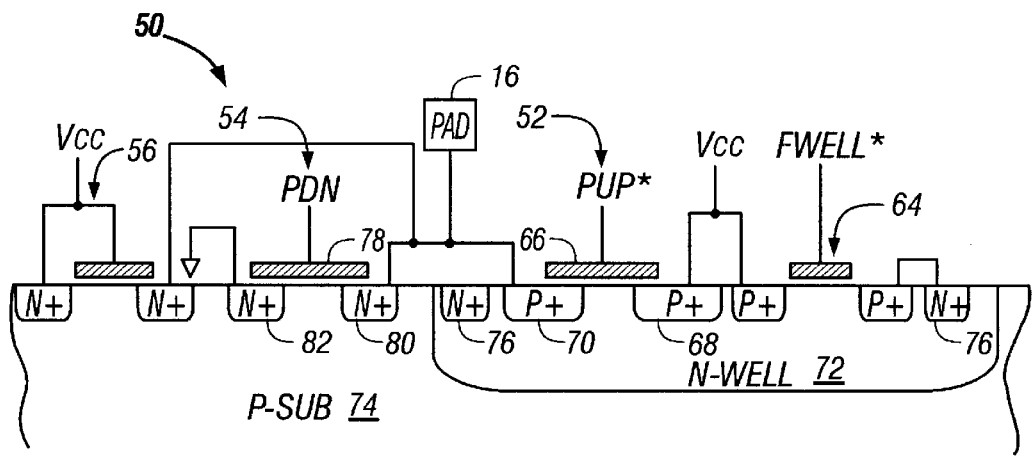
FIG. 4 is a side cross-sectional view of the output driver circuit of FIG. 3 implemented on a silicon substrate.

Turning now to FIG. 4, there is shown a side, cross-sectional view of a portion of output driver circuit 50 from FIG. 3. As can be observed in FIG. 4, pull-up transistor 52 comprises a gate terminal 66 disposed between source and drain P+ diffusions 68 and 70, respectively. Source diffusion 68 is coupled to the supply potential $V_{cc}$; drain diffusion 70 is coupled to I/O pad terminal 16. Pull-up transistor 52 is formed in an N-well 72 formed in P-substrate 74. To isolate pull-up transistor 52 and improve latch-up immunity, an N+ guard ring 76 encircles pull-up transistor 52, similar conceptually to guard ring 32 in the embodiment shown in FIG. 2a. However, in accordance with one aspect of the invention, guard ring 76 is not coupled directly to $V_{cc}$, but instead is coupled to $V_{cc}$ via P-channel decoupling transistor 64 which is controlled with the FWELL* output from overdrive detector 58 (not shown in FIG. 4).

With continued reference to FIG. 4, driver 50 further comprises pull-down transistor 54 having a gate 78 disposed between N+ diffusion regions 80 and 82, respectively.

Figure 5:
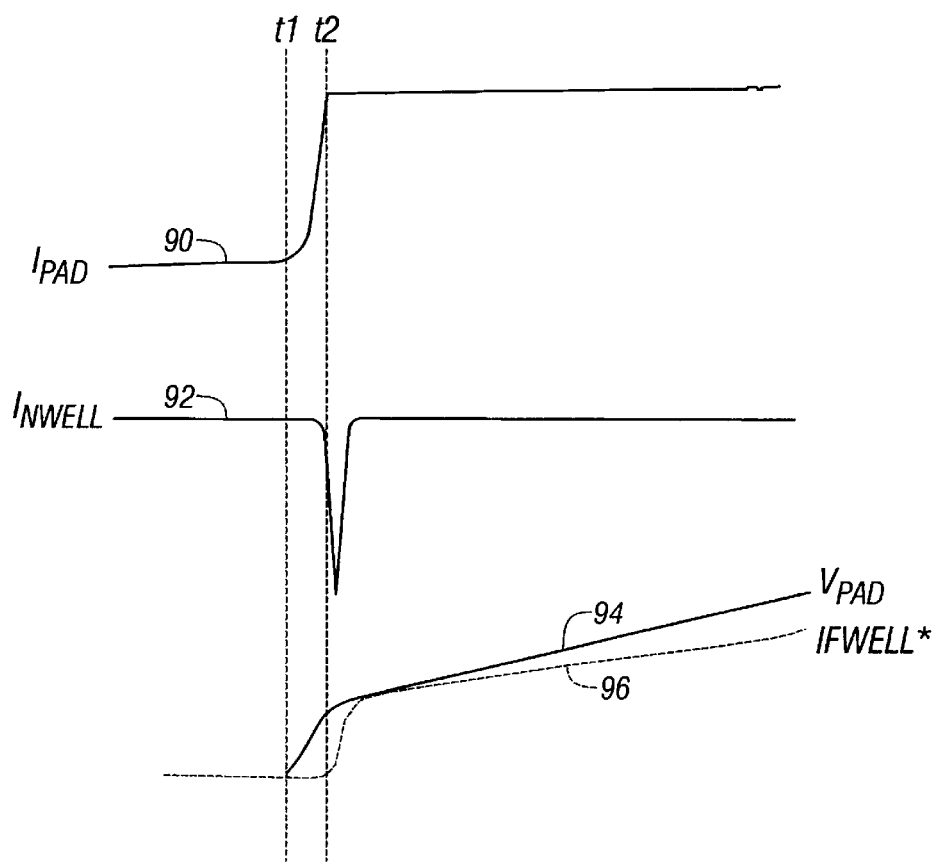
FIG. 5 is a timing diagram showing the levels of various voltages and currents during operation of the output driver circuit of FIG. 3.

Referring now to FIG. 5, there is shown a timing diagram of certain voltages and currents present in driver circuit 50 from FIG. 4 in operation. In particular, FIG. 5 shows an $I_{PAD}$ current 90 injected into pad 16 to create an illustrative test condition for driver 50, the parasitic current $I_{NWELL}$ 92 flowing into N-well 72 as described above as a result of the overdriving caused by the injected current $I_{FWELL}$, the resulting voltage $V_{PAD}$ 94 on I/O pad, and the FWELL* control signal voltage (dashed line 96) applied to the gate of decoupling transistor 64 during the overdrive condition on pad 16.

As can be seen in the example of FIG. 5, initially, until time t1, the injected current $I_{PAD}$ is assumed to be substantially zero. At time t1, current begins being injected into pad 16 causing an overdrive condition thereon. In the hypothetical example of FIG. 5, injected current $I_{PAD}$ 90 ranges from zero at time t1 to a sustained maximum level of, for example, 100 milliamps. As injected current $I_{PAD}$ rises starting at time $t_1$, the voltage $V_{PAD}$ 94 on pad 16 also increases. At time t2, an overdrive condition begins occurring on pad 16, such that there is a marked spike in parasitic current $I_{NWELL}$ 92, at approximately time $t_2$ in FIG. 5.

However, as the overdrive condition develops, overdrive detection circuit 58 will react by deasserting FWELL* control signal 96. As this occurs, P-channel transistor 64 begins to turn off, thereby decoupling guard ring 76 from supply potential $V_{cc}$. Turning off transistor 64 thereby prevents parasitic current $I_{NWELL}$ from being injected into N-well 72, thereby averting latch-up of device 50. As can be seen in FIG. 5, shortly after time t2, therefore, the spike in $I_{NWELL}$ parasitic current 92 ceases.

As can be observed in FIG. 5, $F_{WELL}$ signal 96 substantially follows pad voltage $V_{PAD}$ 94, but only at such times as an overdrive condition occurs on pad 16. At all other times, $F_{WELL}$ 96 is substantially zero, thereby leaving decoupling transistor 64 turned on and guard ring 76 coupled to $V_{cc}$.

From the foregoing detailed description of specific embodiments of the invention, it should be apparent that write path circuitry for a double-data-rate synchronous DRAM has been disclosed in which the setup and hold times for the write data is independently adjustable for rising and falling edge data. Although specific embodiments of the invention have been disclosed herein in some detail, this has been done solely for the purposes of describing various features and aspects of the invention, and is not intended to be limiting with respect to the scope of the invention. It is contemplated that various substitutions, alterations, and/or modifications may be made to the disclosed embodiment, including but not limited to those implementation variations which may have been suggested herein, may be made to the disclosed embodiments without departing from the spirit and scope of the invention as defined by the appended claims, which follow.

What is claimed is:

1. An output driver circuit coupled to an output pad of a semiconductor device, comprising:

a pull-up transistor having a first terminal coupled to a supply potential and a second terminal coupled to said output pad, said pull-up transistor having a gate terminal responsive to application of a pull-up signal asserted thereon to couple said output pad to said supply potential;

a pull-down transistor having a first terminal coupled to said output pad and a second terminal coupled to a ground potential, said pull-down transistor having a gate terminal responsive to application of a pull-down signal asserted thereon to couple said output pad to said ground potential;

said output driver circuit being implemented as a CMOS circuit with a first doped region being in contact with said supply potential and a second doped region selectively coupled to said first doped region such that when said first doped region and said second doped region are connected, an overdrive condition on said output pad causes parasitic current to flow between said first and second doped regions;

said output driver circuit further comprising:

an overdrive detection circuit comprising a p-channel transistor having a substrate and source terminal each coupled to said output pad, having a drain terminal coupled to ground potential via a resistive coupling, and having a gate terminal having a bias voltage applied thereto, said bias voltage being greater than said ground potential and less than said supply voltage, said overdrive detection circuit responsive to an overdrive condition on said pad to deassert a control signal; and a decoupling transistor coupled to said first doped region, said second doped region, and said overdrive detection circuit, said decoupling transistor being responsive to deassertion of said control signal to decouple said first doped region from said second doped region.

2. The output driver circuit in accordance with claim 1, wherein said semiconductor device is a dynamic random access memory device.

3. The output driver circuit in accordance with claim 1, wherein said overdrive condition comprises a voltage exceeding a specified level on a node in said output driver circuit.

4. The output driver circuit in accordance with claim 1, wherein said second doped region comprises a guard ring.

5. The output driver circuit in accordance with claim 4, wherein said guard ring surrounds said pull-up transistor.

6. The output driver circuit in accordance with claim 5, wherein said second doped region comprises an N-well within which said pull-up transistor is formed.

7. The output driver circuit in accordance with claim 1, wherein said overdrive detection circuit comprises a detection transistor having a gate to which a predetermined constant biasing voltage is applied, a source coupled to said output pad, and a drain coupled a gate of said decoupling transistor.

8. The output driver circuit in accordance with claim 1, wherein said predetermined constant biasing voltage is selected such that the voltage on said drain of said detection transistor substantially follows the voltage on said output pad when overdrive conditions are present on said output pad.

9. The output driver circuit in accordance with claim 8, further comprising at least one transistor establishing a resistive coupling between said drain of said detection transistor and said ground potential.

10. The output driver circuit in accordance with claim 1, wherein said resistive coupling comprises a resistance of approximately 1 megaohm coupled between said drain terminal of said p-channel transistor and ground potential.

11. The output driver circuit in accordance with claim 1, wherein said resistive coupling comprises a resistance of approximately 1 megaohm coupled between said drain terminal of said p-channel transistor and ground potential.

12. An output driver circuit coupled to an output node for a semiconductor device, comprising:

a pull-up transistor coupled between said output node and a supply potential, said pull-up transistor being formed in an N-well formed on a P-type substrate;

a pull-down transistor coupled between said output node and a ground potential;

a well tie-down region formed in said N-well and selectively coupled to said supply potential by a decoupling transistor;

an overdrive detection circuit comprising a p-channel transistor having a substrate and source terminal each coupled to said output pad and having a drain terminal coupled to a gate terminal of said decoupling transistor and further coupled to ground potential via a resistive coupling, and having a gate terminal having a bias voltage applied thereto, said bias voltage being greater than said ground potential and less than said supply potential, said overdrive detection circuit being responsive only to an overdrive condition occurring on said output node to turn off said decoupling transistor.

13. The output driver circuit in accordance with claim 12, wherein said semiconductor device is a dynamic random access memory device.

14. The output driver circuit in accordance with claim 12, wherein said overdrive condition comprises a voltage exceeding a specified level on a node in said output driver circuit.

15. The output driver circuit in accordance with claim 12, wherein said overdrive condition comprises an injected current exceeding a specified level on a node in said output driver circuit.

16. The output driver circuit in accordance with claim 15, wherein said overdrive detection circuit further comprises at least one transistor establishing a resistive coupling between said second terminal of said decoupling transistor and said ground potential.

17. The output driver circuit in accordance with claim 12, wherein said overdrive detection circuit comprises a detection transistor having a first terminal coupled to said output terminal a second terminal coupled to a gate of said decoupling transistor, and a gate terminal coupled to a bias voltage source.

18. The output driver circuit in accordance with claim 17, wherein said overdrive detection circuit further comprises at least one transistor establishing a resistive coupling between said second terminal of said decoupling transistor and said ground potential.

* * * * *